(12) United States Patent
Lin et al.

(10) Patent No.: US 11,573,704 B2
(45) Date of Patent: Feb. 7, 2023

(54) MEMORY CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW); Hsiao-Yi Lin, Yilan County (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 56 days.

(21) Appl. No.: 16/529,807

(22) Filed: Aug. 2, 2019

(65) Prior Publication Data

US 2020/0379654 A1    Dec. 3, 2020

(30) Foreign Application Priority Data

May 30, 2019  (TW) .................................. 108118844

(51) Int. Cl.
*G06F 12/00* (2006.01)
*G06F 3/06* (2006.01)
(Continued)

(52) U.S. Cl.
CPC .......... *G06F 3/0611* (2013.01); *G06F 3/0659* (2013.01); *G06F 3/0679* (2013.01); *G11C 16/26* (2013.01); *G11C 16/0483* (2013.01)

(58) Field of Classification Search
CPC .... G06F 3/0611; G06F 3/0659; G06F 3/0679; G06F 3/0685; G06F 3/0688;
(Continued)

(56) References Cited

U.S. PATENT DOCUMENTS

| | | | |
|---|---|---|---|
| 2011/0066902 A1* | 3/2011 | Sharon | G11C 29/50 714/721 |
| 2015/0095741 A1* | 4/2015 | Lin | G06F 11/1048 714/773 |

(Continued)

FOREIGN PATENT DOCUMENTS

| | | |
|---|---|---|
| CN | 102884585 | 1/2013 |
| TW | I648634 | 1/2019 |

(Continued)

OTHER PUBLICATIONS

"Office Action of Taiwan Counterpart Application", dated Jun. 24, 2020, p. 1-p. 6.
(Continued)

*Primary Examiner* — Arvind Talukdar
(74) *Attorney, Agent, or Firm* — JCIPRNET

(57) ABSTRACT

A memory control method, a memory storage device and a memory control circuit unit are provided. The method includes: reading a first physical unit among a plurality of physical units based on a first electrical configuration to obtain first soft information; reading the first physical unit based on a second electrical configuration which is different from the first electrical configuration to obtain second soft information; classifying a plurality of memory cells in the first physical unit according to the first soft information and (Continued)

the second soft information; and decoding data read from the first physical unit according to a classification result of the memory cells.

12 Claims, 8 Drawing Sheets

(51) Int. Cl.
*G11C 16/26* (2006.01)
*G11C 16/04* (2006.01)
(58) Field of Classification Search
CPC ............. G06F 12/0238; G06F 12/0246; G06F 2212/2022; G06F 2212/2024; G06F 2212/205; G06F 2212/214; G06F 2212/2142; G06F 2212/2146; G06F 2212/217; G06F 2212/72; G06F 2212/7201; G06F 2212/7202; G06F 2212/7203; G06F 2212/7204; G06F 2212/7205; G06F 2212/7206; G06F 2212/7207; G06F 2212/7208; G06F 2212/7209; G06F 2212/7211; G11C 16/26; G11C 16/0483; G11C 11/5614; G11C 11/5621; G11C 11/5628; G11C 11/5635; G11C 11/5642; G11C 11/5657; G11C 11/5664; G11C 11/5671; G11C 11/5678; G11C 11/5685; G11C 13/0035; G11C 16/349; G11C 16/3495
See application file for complete search history.

(56) References Cited

U.S. PATENT DOCUMENTS

2015/0255163 A1* 9/2015 Radke .................. G11C 29/021
                                                    365/185.09
2021/0194278 A1* 6/2021 Calvin ...................... H02J 4/00

FOREIGN PATENT DOCUMENTS

TW          201905925        2/2019
TW          I658463          5/2019

OTHER PUBLICATIONS

"Office Action of China Counterpart Application", dated Aug. 25, 2022, p. 1-p. 13.

* cited by examiner

| Original group | New group | Classification result | LLR |
|---|---|---|---|
| A1 | A2 | R1 | L1 |
|  | B2 | R2 | L2 |
|  | C2 | R3 | L3 |
|  | D2 | R4 | L4 |
|  | E2 | R5 | L5 |
|  | F2 | R6 | L6 |
| B1 | A2 | R7 | L7 |
|  | B2 | R8 | L8 |
|  | C2 | R9 | L9 |
|  | D2 | R10 | L10 |
|  | E2 | R11 | L11 |
|  | F2 | R12 | L12 |
| ⋮ | ⋮ | ⋮ | ⋮ |

FIG. 9

United States Patent US 11,573,704 B2

MEMORY CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 108118844, filed on May 30, 2019. The entirety of the above-mentioned patent application is hereby incorporated by reference herein and made a part of this specification.

BACKGROUND

Technical Field

The disclosure relates to a memory control technique, and more particularly, to a memory control method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

The memory storage device stores data by changing threshold voltages of memory cells. However, under different electrical conditions and/or temperature conditions, the threshold voltages of the memory cells may be changed. In addition, multiple memory cells in the same memory storage device may have different sensitivities to electrical conditions and/or temperature conditions due to process variations. Therefore, when the electrical conditions and/or temperature conditions are changed, if the same decoding configuration is continuously used to decode data read from the memory cells, a data decoding efficiency and/or a data access efficiency of the memory storage device may be reduced.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a memory control method, a memory storage device and a memory control circuit unit, which are capable of solving the problems described above.

Exemplary embodiments of the disclosure provides a memory control method for a rewritable non-volatile memory module. The rewritable non-volatile memory module includes a plurality of physical units, and the memory control method includes steps of: reading a first physical unit among the physical units based on a first electrical configuration to obtain first soft information; reading the first physical unit based on a second electrical configuration to obtain second soft information, wherein the first electrical configuration is different from the second electrical configuration; classifying a plurality of memory cells in the first physical unit according to the first soft information and the second soft information; and decoding data read from the first physical unit according to a classification result of the memory cells.

Exemplary embodiments of the disclosure further provides a memory storage device, which includes a connection interface unit, a rewritable non-volatile memory module and a memory control circuit unit. The connection interface unit is configured to couple to a host system. The rewritable non-volatile memory module includes a plurality of physical units. The memory control circuit unit is coupled to the connection interface unit and the rewritable non-volatile memory module. The memory control circuit unit is configured to send a first read command sequence which instructs a reading of a first physical unit among the physical units based on a first electrical configuration to obtain first soft information. The memory control circuit unit is further configured to send a second read command sequence which instructs a reading of the first physical unit based on a second electrical configuration to obtain second soft information, wherein the first electrical configuration is different from the second electrical configuration. The memory control circuit unit is further configured to classify a plurality of memory cells in the first physical unit according to the first soft information and the second soft information, and the memory control circuit unit is further configured to decode data read from the first physical unit according to a classification result of the memory cells.

Exemplary embodiments of the disclosure further provides a memory control circuit unit, which is configured to control a rewritable non-volatile memory module. The rewritable non-volatile memory module includes a plurality of physical units. The memory control circuit unit includes a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface and the error checking and correcting circuit. The memory management circuit is configured to send a first read command sequence which instructs a reading of a first physical unit among the physical units based on a first electrical configuration to obtain first soft information. The memory management circuit is further configured to send a second read command sequence which instructs a reading of the first physical unit based on a second electrical configuration to obtain second soft information, wherein the first electrical configuration is different from the second electrical configuration. The memory management circuit is further configured to classify a plurality of memory cells in the first physical unit according to the first soft information and the second soft information, and the error checking and correcting circuit is configured to decode data read from the first physical unit according to a classification result of the memory cells.

Based on the above, after obtaining the first soft information and the second soft information by reading the first physical unit via different electrical configurations separately, the memory cells in the first physical unit may be classified according to the first soft information and the second soft information. Then, the data read from the first physical unit may be decoded according to the classification result, thereby improving the data decoding efficiency and/or the data access efficiency of the memory storage device.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 9 is a schematic diagram illustrating table information according to an exemplary embodiment of the disclosure

DESCRIPTION OF THE EMBODIMENTS

Figure 1:
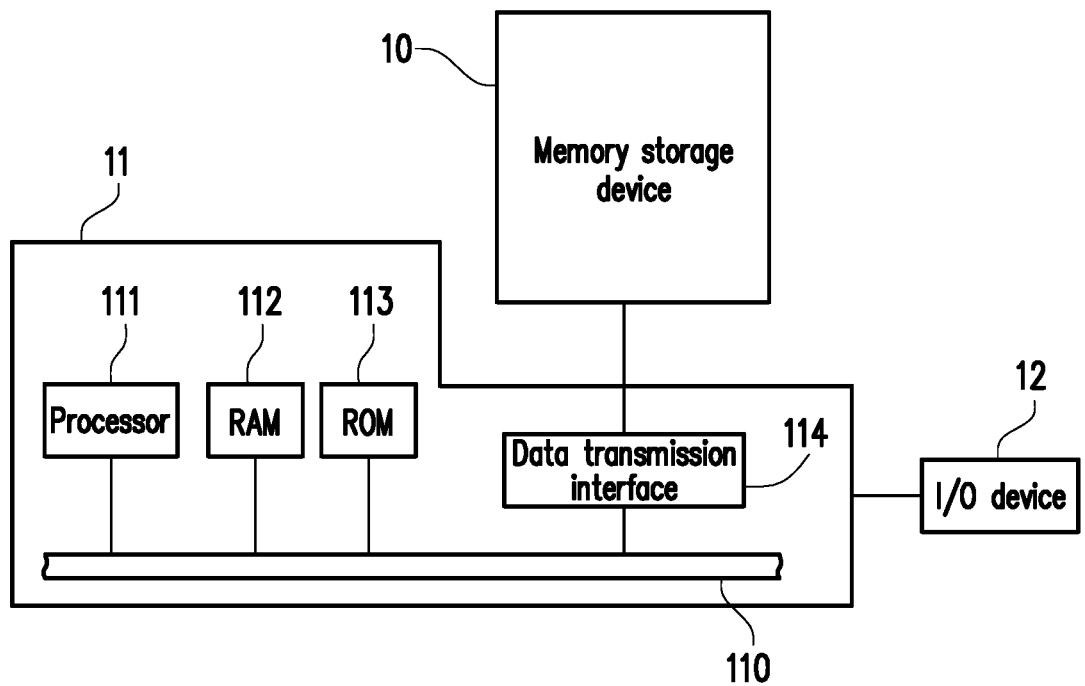
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
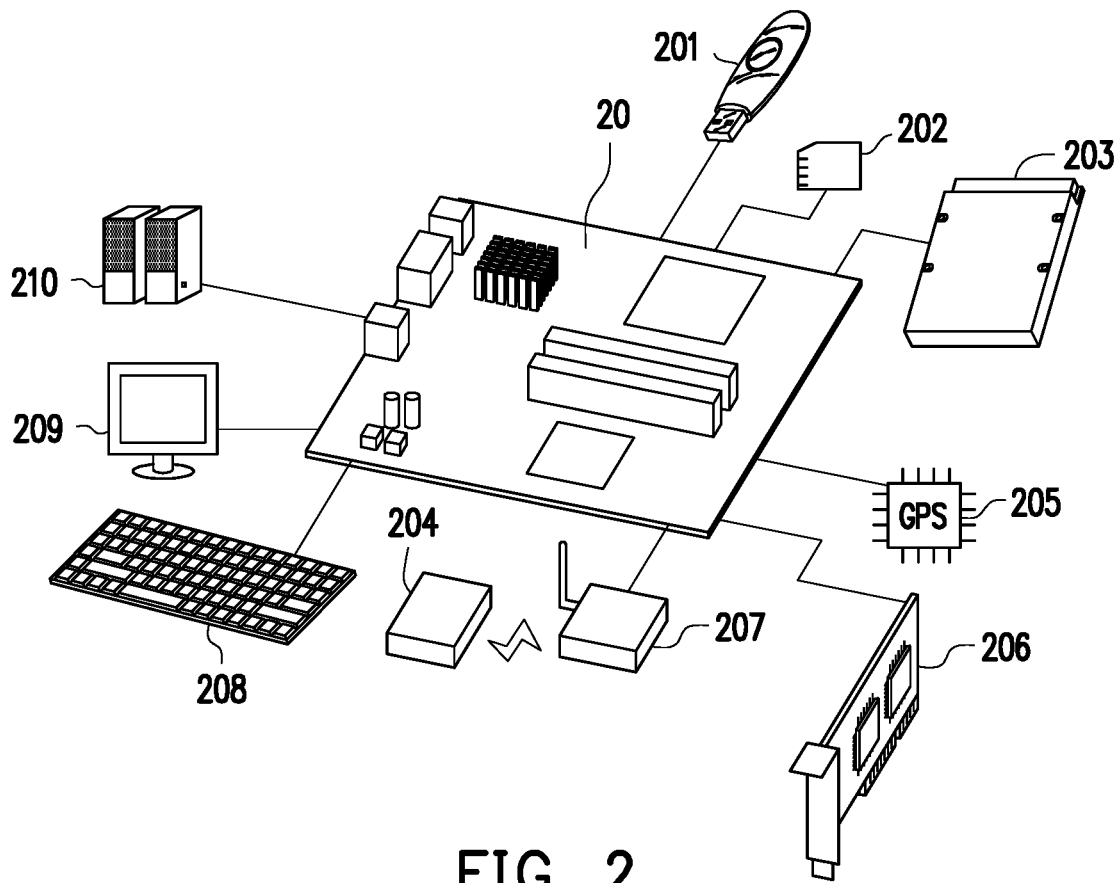
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In this exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
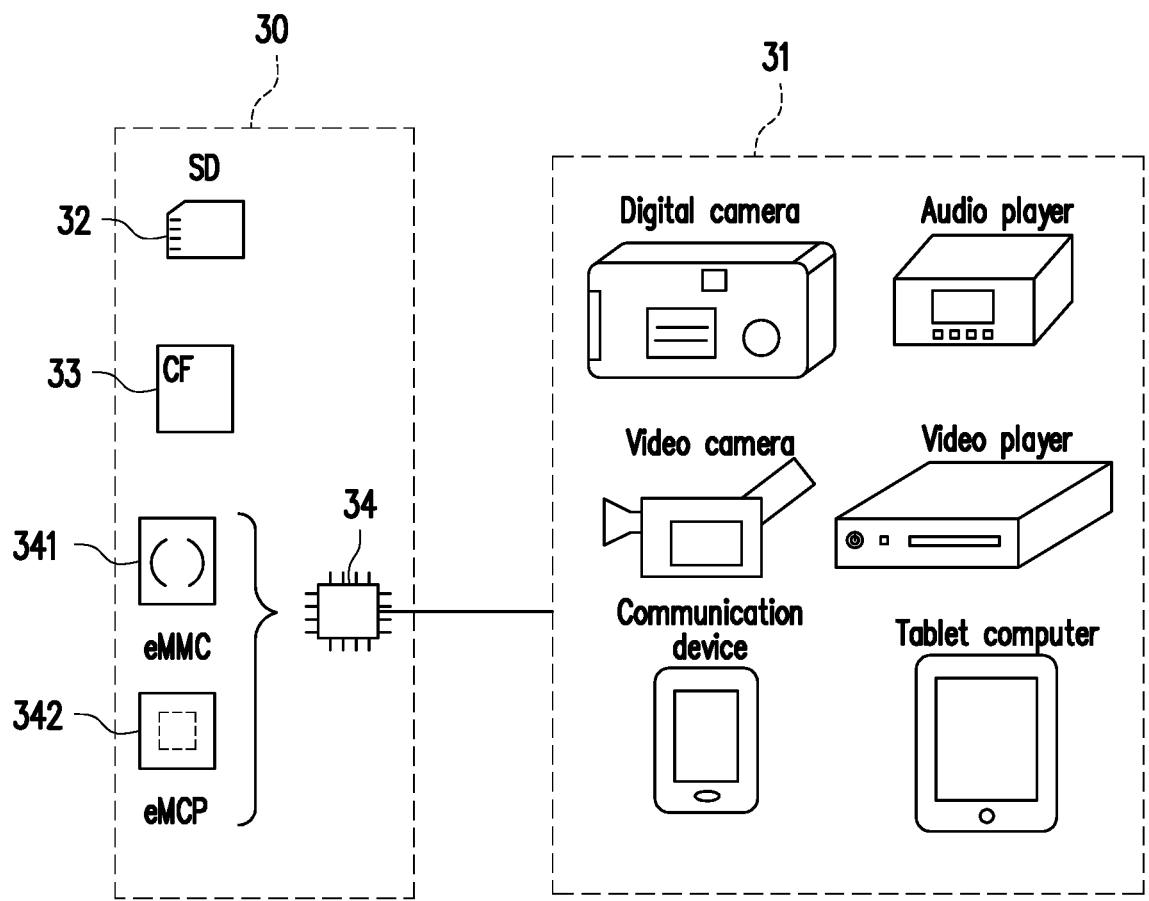
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
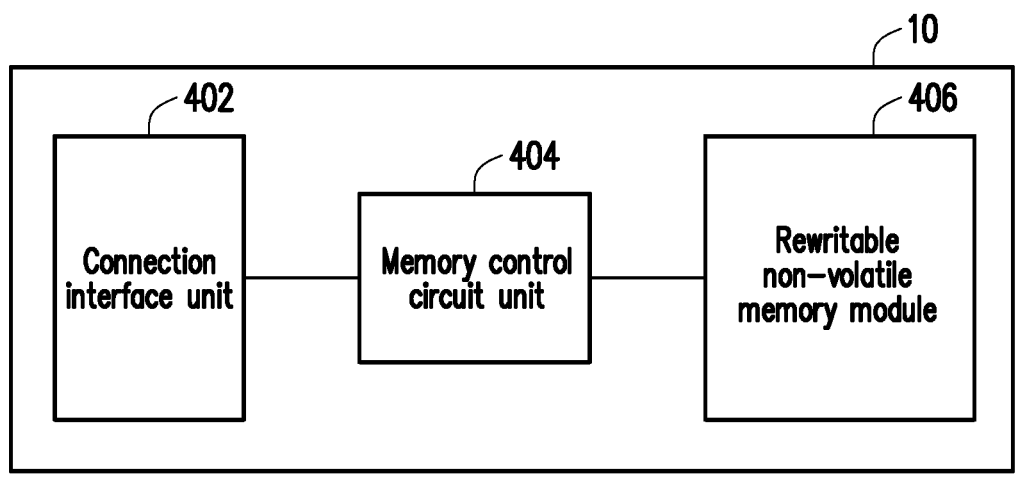
FIG. 4 is a schematic block diagram illustrating a memory storage device according to an exemplary embodiment of the disclosure.

FIG. 4 is a schematic block diagram illustrating a memory storage device according to an exemplary embodiment of the disclosure. Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. The memory storage device 10 can communicate with the host system 11 through the connection interface unit 402. In this exemplary embodiment, the connection interface unit 402 is compatible with a SATA (Serial Advanced Technology Attachment) standard. Nevertheless, it should be understood that the disclosure is not limited in this regard. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 406, one or more bits are stored by changing a voltage (a.k.a. a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 406 can have a plurality of storage states. The storage state to which the memory cell belongs may be determined by applying a read voltage to the memory cell to thereby obtain the one or more bits stored in the memory cell.

In this exemplary embodiment, the memory cells of the rewritable non-volatile memory module 406 can constitute a plurality of physical programming units, and the physical programming units can constitute a plurality of physical erasing units. Specifically, the memory cells on the same word line can constitute one or more of the physical programming units. If each of the memory cells can store two or more bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units can include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also include 8, 16 physical sectors or a different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
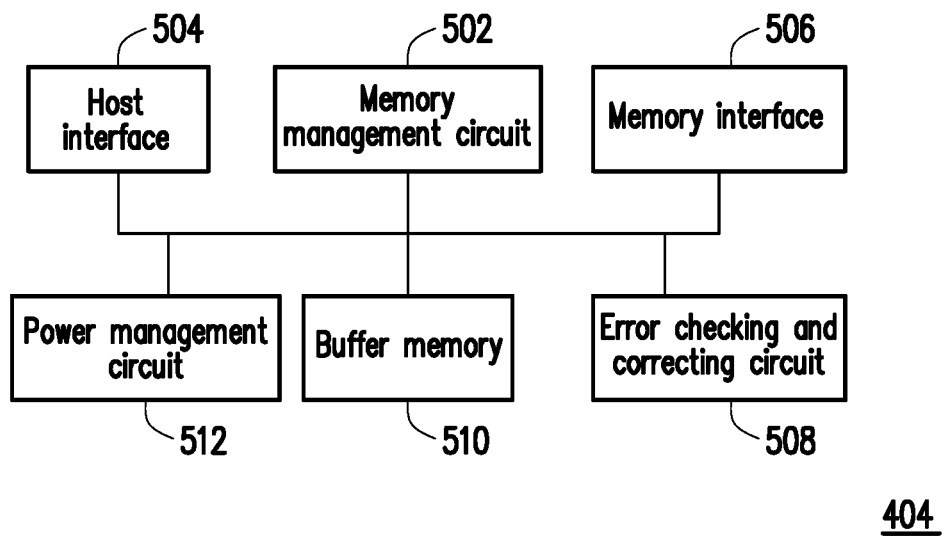
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure. Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, operations of the memory management circuit 502 are described as equivalent to operations of the memory control circuit unit 404.

In this exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, a system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells or the memory cell groups of the rewritable non-volatile memory module 406. The memory writing circuit is configured to send a write command sequence which instructs the rewritable non-volatile memory module 406 to write data into the rewritable non-volatile memory module 406. The memory reading circuit is configured to send a read command sequence which instructs the rewritable non-volatile memory module 406 to read data from the rewritable non-volatile memory module 406. The memory erasing circuit is configured to send an erase command sequence which instructs the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. Each of the write command sequence, the read command sequence and the erase command sequence may include one or more program codes or command codes and instruct the rewritable non-volatile memory module 406 to execute the corresponding operations, such as writing, reading and erasing. In an exemplary embodiment, the memory management circuit 502 may further send command sequence of other types to instruct the rewritable non-volatile memory module 406 to perform the corresponding operations.

The host interface 504 is coupled to the memory management circuit 502. The memory management circuit 502 can communicate with the host system 11 through the host interface 504. The host interface 504 may be used to receive and identify commands and data transmitted by the host system 11. For example, the commands and the data transmitted by the host system 11 may be transmitted to the memory management circuit 502 via the host interface 504. In addition, the memory management circuit 502 can transmit data to the host system 11 via the host interface 504. In this exemplary embodiment, the host interface 504 is compatible with the SATA standard. Nevertheless, it should be understood that the disclosure is not limited in this regard. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

The error checking and correcting circuit 508 is coupled to the memory management circuit 502 and configured to perform an error checking and correcting operation to ensure the correctness of data. Specifically, when the memory management circuit 502 receives the writing command from the host system 11, the error checking and correcting circuit 508 generates an error correcting code (ECC) or an error detecting code (EDC) for data corresponding to the writing command, and the memory management circuit 502 writes data and the ECC or the EDC corresponding to the writing command to the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In an exemplary embodiment, the memory control circuit unit 404 further includes a buffer memory 510 and a power management circuit 512. The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In an exemplary embodiment, the rewritable non-volatile memory module 406 of FIG. 4 is also known as a flash memory module. In an exemplary embodiment, the memory control circuit unit 404 of FIG. 4 is also known as a flash memory controller for controlling the flash memory module. In an exemplary embodiment, the memory management circuit 502 of FIG. 5 is also known as a flash memory management circuit.

Figure 6:
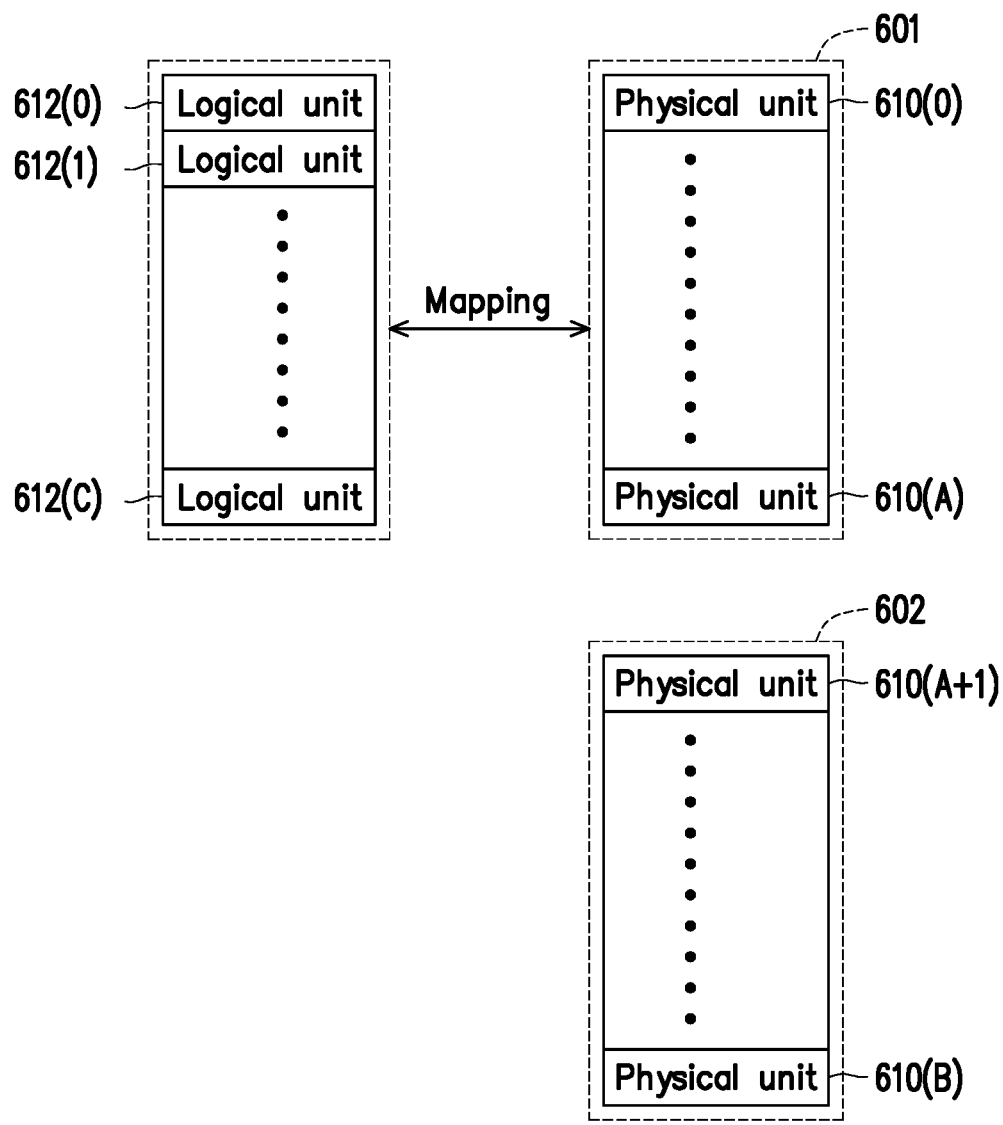
FIG. 6 is a schematic diagram illustrating management of a rewritable non-volatile memory module according to an exemplary embodiment of the disclosure.

FIG. 6 is a schematic diagram illustrating management of a rewritable non-volatile memory module according to an exemplary embodiment of the disclosure. Referring to FIG. 6, the memory management circuit 502 can logically group physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and these errors cannot be corrected, the specific physical unit is regarded as a damaged physical unit. It should be noted that, if there are no available physical erasing units in the replacement area 602, the memory management circuit 502 may declare the memory storage device 10 as in a write protect state so data can no longer be written thereto.

In an exemplary embodiment, each physical unit refers to one physical programming unit. However, in another exemplary embodiment, one physical unit may also refer to one physical address, one physical erasing unit, or a composition of a plurality of continuous or discontinuous physical addresses. The memory management circuit 502 can assign logical units 612(0) to 612(C) to map the physical units 610(0) to 610(A) in the storage area 601. In the present exemplary embodiment, each logical unit refers to one logical address. However, in another exemplary embodiment, each logical unit may also refer to one logical programming unit, one logical erasing unit or a composition of a plurality of continuous or discontinuous logical addresses. In addition, each of the logical units 612(0) to 612(C) may be mapped to one or more physical units.

In an exemplary embodiment, the memory management circuit 502 can record a mapping relation (a.k.a. a logical-physical address mapping relation) between the logical units and the physical units into at least one logical-physical address mapping table. When the host system 11 intends to read the data from the memory storage device 10 or write data into the memory storage device 10, the memory management circuit 502 can perform a data accessing operation on the memory storage device 10 according to the logical-physical address mapping table.

It is noted that in the following description, some terms may be replaced with corresponding abbreviations for ease of reading (see Table 1).

TABLE 1

| rewritable non-volatile memory module | RNVM module |
| memory management circuit | MMC |
| error checking and correcting circuit | ECCC |
| read voltage level | RVL |

In an exemplary embodiment, the MMC 502 can send a read command sequence (a.k.a. a first read command sequence) to the RNVM module 406. The first read command sequence can instruct the RNVM module 406 to read one specific physical unit (a.k.a. a first physical unit) based on one specific electrical configuration (a.k.a. a first electrical configuration) to obtain soft information (a.k.a. first soft information). In addition, the MMC 502 can send another read command sequence (a.k.a. a second read command sequence) to the RNVM module 406. The second read command sequence can instruct the RNVM module 406 to read the first physical unit based on another specific electrical configuration (a.k.a. a second electrical configuration) to obtain corresponding soft information (a.k.a. second soft information). The first electrical configuration is different from the second electrical configuration.

In an exemplary embodiment, in response to the first read command sequence, the RNVM module 406 can read the first physical unit by using a plurality of RVLs (a.k.a. first RVLs) corresponding to the first electrical configuration to obtain the first soft information. Similarly, in response to the second read command sequence, the RNVM module 406 can read the first physical unit by using a plurality of RVLs (a.k.a. second RVLs) corresponding to the second electrical configuration to obtain the second soft information.

In an exemplary embodiment, a current value of a read current (a.k.a. a first read current) used by the RNVM module 406 based on the first electrical configuration is different from a current value of a read current (a.k.a. a second read current) used by the RNVM module 406 based on the second electrical configuration. In response to the read current being changed (e.g., changed from the first read current to the second read current), the first RVLs are also different from the second RVLs. Alternatively, from another perspective, an electrical difference between the first electrical configuration and the second electrical configuration may include a difference between the current value of the first read current and the current value of the second read current. In an exemplary embodiment, the first read current may be specified by the first electrical configuration (and/or the MMC 502), and/or the second read current may be specified by the second electrical configuration (and/or the MMC 502).

In an exemplary embodiment, the MMC 502 can classify a plurality of memory cells in the first physical unit according to the first soft information and the second soft information. The ECCC 508 can decode data read from the first physical unit according to a classification result of the memory cells. For example, according to the classification result of one specific memory cell (a.k.a. a first memory cell) in the first physical unit, the ECCC 508 can determine reliability information (a.k.a. first reliability information) corresponding to the first memory cell. The MMC 502 can send a read command sequence (a.k.a. a third read command sequence) as an instruction for reading the data from the first physical unit containing the first memory cell. The ECCC 508 can decode the data read from the first memory cell according to the first reliability information.

In an exemplary embodiment, the first reliability information is dynamically determined according to a classification result of the first memory cell. The first reliability information is different from a preset reliability information corresponding to the first memory cell. For example, the preset reliability information corresponding to the first memory cell may be determined and/or provided by a supplier of the RNVM module 406 (e.g., recorded in a management table provided by the supplier and stored in the RNVM module 406), and the preset reliability information may be obtained without going through a dynamic operation. In an exemplary embodiment, the first reliability information may be obtained through a real-time operation and/or may not be recorded in the management table provided by the supplier. In an exemplary embodiment, as compared to the process of decoding the data read from the first memory cell by using the preset reliability information, the process of decoding the data read from the first memory cell by using the first reliability information can improve a decoding efficiency (e.g., a decoding success rate) of the data read from the first memory cell.

In an exemplary embodiment, the classification result of the first memory cells reflects a sensitivity of the first memory cell to a change of an electrical parameter (or the electrical configuration). For example, according to the first soft information and the second soft information, the MMC 502 can classify the first memory cell into a first-type memory cell or a second-type memory cell. A sensitivity of the first-type memory cell to the change of the electrical parameter is different from a sensitivity of the second-type memory cell to the change of the electrical parameter. For example, the sensitivity of the first-type memory cell to the change of the electrical parameter may be higher than the sensitivity of the second-type memory cell to the change of the electrical parameter. In addition, the electrical parameter may be any parameter that may be affected by the electrical difference between the first electrical configuration and the second electrical configuration electrical described above, such as the read current for reading the first memory cell.

In an exemplary embodiment, the MMC 502 can obtain a change of the threshold voltage of the first memory cell caused by the change of the electrical parameter (or the electrical configuration) according to the first soft information and the second soft information. The change of the threshold voltage can reflect a sensitivity of the first memory cell to the change of the electrical parameter (or the electrical configuration). The MMC 502 can determine the first reliability information according to the change of the threshold voltage.

Figure 7:
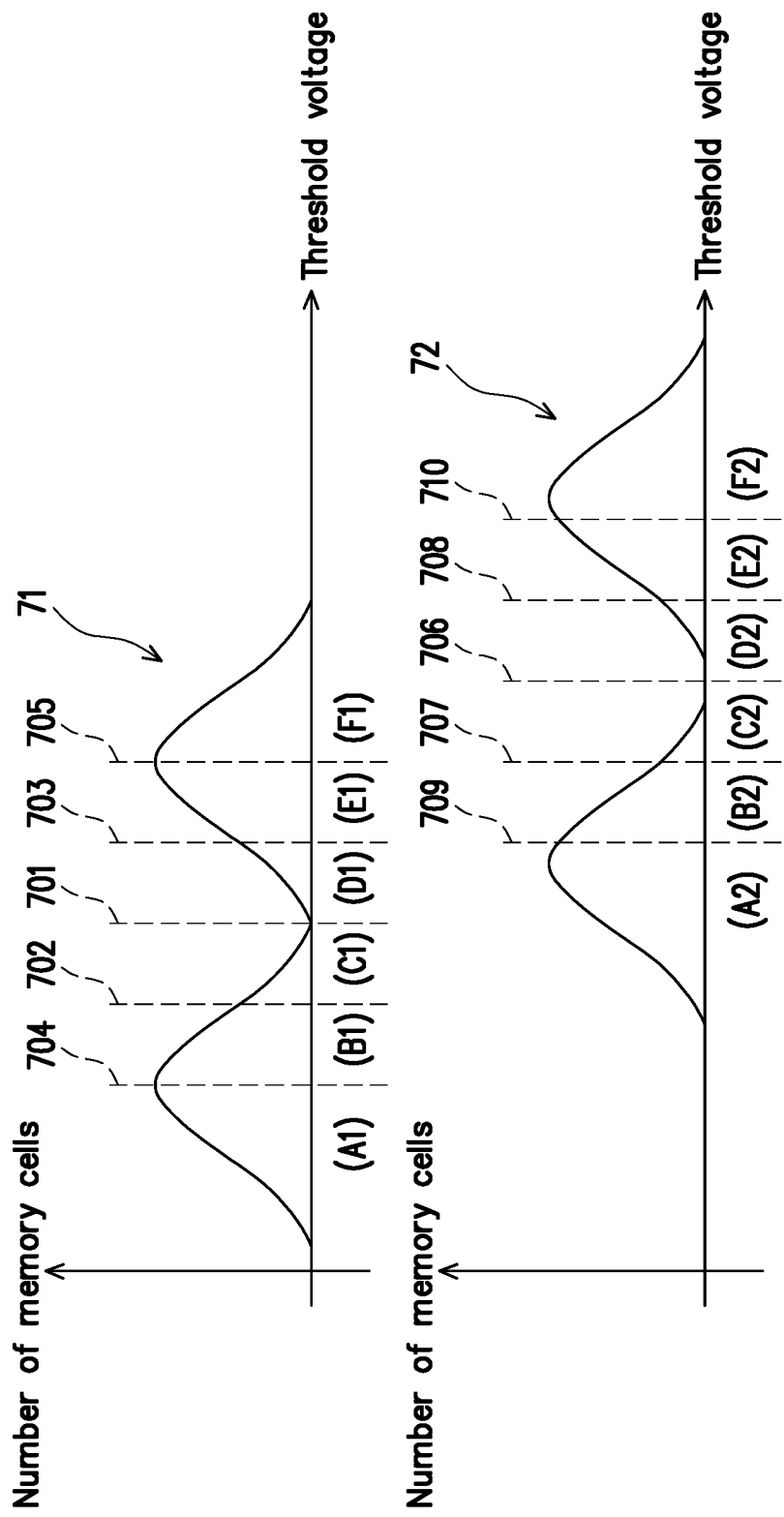
FIG. 7 is a schematic diagram illustrating the first physical unit read based on the first electrical configuration and the second electrical configuration according to an exemplary embodiment of the disclosure.

FIG. 7 is a schematic diagram illustrating the first physical unit read based on the first electrical configuration and the second electrical configuration according to an exemplary embodiment of the disclosure. With reference to FIG. 7, it is assumed that the first electrical configuration corresponds to a first read current; the second electrical configuration corresponds to a second read current; and a difference value between the first read current and the second read current is ΔI. In other words, ΔI can reflect the change of the electrical parameter (e.g., the read currents) between the first electrical configuration and the second electrical configuration.

When the first physical unit is read based on the first electrical configuration, a threshold voltage distribution of the memory cells in the first physical unit may be as shown by a distribution 71. According to the first read command sequence, the RNVM module 406 can determine a plurality of RVLs 701 to 705 based on the first electrical configuration. For example, the RVLs 701 to 705 may be determined according to the first read current corresponding to the first electrical configuration. The RNVM module 406 can read the memory cells in the first physical unit by sequentially using the RVLs 701 to 705 to obtain the first soft information.

According to a reading result of the RVLs 701 to 705 (i.e., the first soft information), the threshold voltage of each memory cell in the first physical unit may be grouped as belonging to one specific voltage range among voltage ranges A1 to F1. For example, if the first soft information reflects that the threshold voltage of the first memory cell is lower than the RVL 704, the threshold voltage of the first memory cell may be grouped as belonging to the voltage range A1. If the first soft information reflects that the threshold voltage of the first memory cell is between the RVLs 704 and 702, the threshold voltage of the first memory cell may be grouped as belonging to the voltage range B1. If the first soft information reflects that the threshold voltage of the first memory cell is between the RVLs 702 and 701, the threshold voltage of the first memory cell may be grouped as belonging to the voltage range C1. If the first soft information reflects that the threshold voltage of the first memory cell is between the RVLs 701 and 703, the threshold voltage of the first memory cell may be grouped as belonging to the voltage range D1. If the first soft information reflects that the threshold voltage of the first memory cell is between the RVLs 703 and 705, the threshold voltage of the first memory cell may be grouped as belonging to the voltage range E1. Further, if the first soft information reflects that the threshold voltage of the first memory cell is higher than the RVL 705, the threshold voltage of the first memory cell may be grouped as belonging to the voltage range F1.

On the other hand, when switching to read the first physical unit based on the second electrical configuration, in response to the change of the electrical parameter (e.g., ΔI) between the first electrical configuration and the second electrical configuration, the threshold voltage distribution of the memory cells in the first physical unit may be changed from the distribution 71 to a distribution 72. According to the second read command sequence, the RNVM module 406 can determine a plurality of RVLs 706 to 710 based on the second electrical configuration. For example, the RVLs 706 to 710 may be determined according to the second read current corresponding to the second electrical configuration. The RNVM module 406 can read the memory cells in the first physical unit by sequentially using the RVLs 706 to 710 to obtain the second soft information. In addition, according to a reading result of the RVLs 706 to 710 (i.e., the second soft information), the threshold voltage of the first memory cell may be grouped as belonging to one specific voltage range among voltage ranges A2 to F2. For example, if the second soft information reflects that the threshold voltage of the first memory cell is between the RVLs 706 and 708, the threshold voltage of the first memory cell may be grouped as belonging to the voltage range D2, and so on and so forth.

It should be noted that, in an exemplary embodiment of FIG. 7, the RVLs 701 to 705 correspond to the RVLs 706 to 710 in one-to-one manner. For example, in response to ΔI, the RVL 701 is automatically changed to be the RVL 706, the RVL 702 is automatically changed to be the RVL 707, and so on and so forth. In addition, the voltage ranges A1 to F1 also correspond to the voltage ranges A2 to F2 in one-to-one manner.

Under ideal conditions, although the threshold voltage of the memory cell is changed due to the change of the electrical parameter (e.g., ΔI), the change of the threshold voltage should not change a relative position of the threshold voltage of one specific memory cell with respect to the entire threshold voltage distribution (or the voltage ranges divided by the RVLs). For example, if the threshold voltage of one specific memory cell belongs to the voltage range B1 in the distribution 71, the threshold voltage of the specific memory cell should belong to the voltage range B2 in the distribution 72 after the read current is changed.

However, in practice, the sensitivities of different memory cells to the change of the electrical parameter may also be different due to factors like process variations between different memory cells. For example, if the threshold voltage of one specific memory cell belongs to the voltage range B1 in the distribution 71, the threshold voltage of the specific memory cell may be changed to belong to the voltage range A2 in the distribution 72 after the read current is changed. Alternatively, if the threshold voltage of another memory cell belongs to the voltage range B1 in the distribution 71, the threshold voltage of said another memory cell may be changed to belong to the voltage range F2 in the distribution 72 after the read current is changed.

In an exemplary embodiment, if a relative voltage position of one specific memory cell in the distributions 71 and 72 is dramatically changed (e.g., changed from the voltage range A1 to the voltage range F2), that specific memory cell is more sensitive to the change of the electrical parameter. Conversely, if a relative voltage position of one specific memory cell in the distributions 71 and 72 is slightly changed (e.g., changed from the voltage range A1 to the voltage range B2) or even unchanged (e.g., changed from the voltage range A1 to the voltage range A2), that specific memory cell is less sensitive to the change of the electrical parameter.

In an exemplary embodiment, the MMC 502 can obtain a voltage change ΔV corresponding to a change of a relative voltage position of the first memory cell in the distributions 71 and 72. Then, the MMC 502 can classify the first memory cell according to the voltage change ΔV. For example, if the change of the relative voltage position of the first memory cell in the distributions 71 and 72 is a change from the voltage range A1 to the voltage range B2, the voltage change ΔV may be determined as a voltage difference corresponding to one voltage range. Alternatively, if the change of the relative voltage position of the first memory cell in the distributions 71 and 72 is a change from the voltage range A1 to the voltage range C2, the voltage change ΔV may be determined as a voltage difference corresponding to two voltage ranges. Alternatively, if the change of the relative voltage position of the first memory cell in the distributions 71 and 72 is a change from the voltage range A1 to the voltage range D2, the voltage change ΔV may be determined as a voltage difference corresponding to three voltage ranges. Alternatively, if the change of the relative voltage position of the first memory cell in the distributions 71 and 72 is a change from the voltage range A1 to the voltage range E2, the voltage change ΔV may be determined as a voltage difference corresponding to four voltage ranges. Alternatively, if the change of the relative voltage position of the first memory cell in the distributions 71 and 72 is a change from the voltage range A1 to the voltage range F2, the voltage change ΔV may be determined as a voltage difference corresponding to five voltage ranges. By analogy, a change from the voltage range B1 to the voltage range D2 (or from E1 to C2) may refer to a voltage difference corresponding to two voltage ranges, and so on and so forth.

In an exemplary embodiment, the MMC 502 can compare the voltage change ΔV with at least one threshold value and classify the first memory cell according to a comparison result. For example, if the voltage change ΔV is greater than one specific threshold value, the MMC 502 can classify the first memory into the first-type memory cell. In addition, if the voltage change ΔV is not greater than the specific threshold value, the MMC 502 can classify the first memory into the second-type memory cell.

In an exemplary embodiment, if the voltage change ΔV is greater than one specific threshold value, the MMC 502 can determine the first memory cell as a memory cell more sensitive to the change of the electrical parameter. Alternatively, if the voltage change ΔV is not greater than the specific threshold value, the MMC 502 can determine the first memory cell as a memory cell less sensitive to the change of the electrical parameter. From another perspective, in an exemplary embodiment, if the first memory cell is classified into the first-type memory cell, the sensitivity of the first memory cell to the change of the electrical parameter may be regarded as being greater than a preset sensitivity. Alternatively, if the first memory cell is classified into the second-type memory cell, the sensitivity of the first memory cell to the change of the electrical parameter may be regarded as not being greater than the preset sensitivity.

It should be noted that, in the exemplary embodiment of FIG. 7, six voltage ranges are divided by using five RVLs so the voltage ranges can be used to substantially identify a voltage value of the current threshold voltage of the first memory cell (e.g., which falls in a specific voltage range). In another exemplary embodiment, the first memory cell may also be read by using more or less RVLs so the voltage value of the current threshold voltage of the first memory cell can be identified based on different resolutions.

Figure 8:
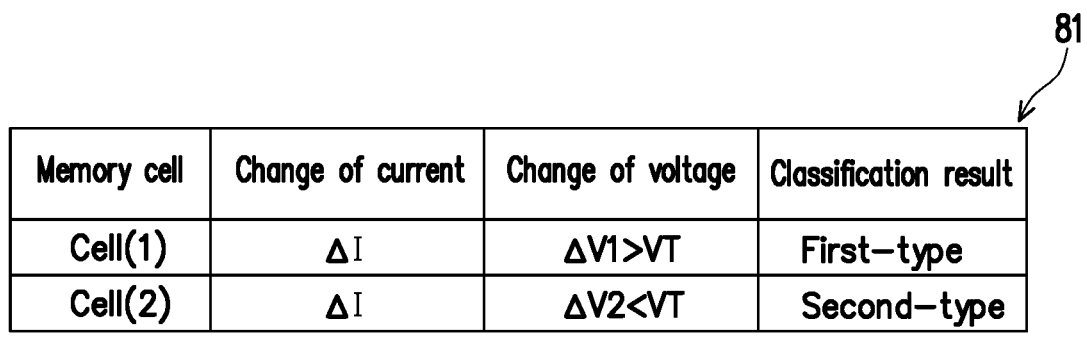
FIG. 8 is a schematic diagram illustrating table information according to an exemplary embodiment of the disclosure

FIG. 8 is a schematic diagram illustrating table information according to an exemplary embodiment of the disclosure. With reference to FIG. 7 and FIG. 8, it is assumed that after a memory cell Cell(1) is read based on the first electrical configuration and the second electrical configuration, the first soft information and the second soft information reflect that, corresponding to a change of current being ΔI, a change of voltage corresponding to the change of the relative voltage position of the memory cell Cell(1) in the distributions 71 and 72 is ΔV1. In response to ΔV1 being greater than a threshold value VT, the memory cell Cell(1) may be classified into the first-type memory cell. According to the classification result of the memory cell Cell(1), the reliability information corresponding to the first-type memory cell may be determined and used for decoding data read from the memory cell Cell(1) in the subsequent process.

In addition, it is assumed that after a memory cell Cell(2) is read based on the first electrical configuration and the second electrical configuration, the first soft information and the second soft information reflect that, corresponding to the change of current being ΔI, a change of voltage corresponding to the change of the relative voltage position of the memory cell Cell(2) in the distributions 71 and 72 is ΔV2. In response to ΔV2 being less than the threshold value VT, the memory cell Cell(2) may be classified into the second-type memory cell. According to the classification result of the memory cell Cell(2), the reliability information corresponding to the second-type memory cell may be determined and used for decoding data read from the memory cell Cell(2) in the subsequent process.

The aforementioned information and other usual information may all be recorded in table information 81. The table information 81 may be load into the buffer memory 510 of FIG. 5 for update and maintenance. When performing a decoding operation, the ECCC 508 of FIG. 5 can determine the reliability information corresponding to the first memory cell according to the table information and decode the data read from the first memory cell according to the reliability information. Further, in an exemplary embodiment, the reliability information corresponding to the first memory cell may also be directly determined according to the voltage ranges of the threshold voltages of the first memory cell in the distributions 71 and 72 respectively.

FIG. 9 is a schematic diagram illustrating table information according to an exemplary embodiment of the disclosure. With reference to FIG. 7 and FIG. 9, in this exemplary embodiment, table information 91 may record the corresponding classification result and the corresponding reliability information corresponding to various paring manners between an original group (i.e., an original voltage range)

and a new group (i.e., a new voltage range). Further, in this exemplary embodiment, the reliability information is exemplified by a log likelihood ratio (LLR) in a LDPC decoding algorithm. In another exemplary embodiment, the reliability information may also be a decoding parameter used in other types of decoding algorithms (e.g., BCH), which are not particularly limited by the disclosure.

In an exemplary embodiment of FIG. 7, if the threshold voltages of the first memory cell in the distributions 71 and 72 respectively belong to the voltage ranges B1 and C2, by checking the table information 91, the classification result of the first memory cell may be R9 and the first reliability information corresponding to the first memory cell may be determined as L9 (or may be obtained through a further calculation based on L9). Alternatively, in another exemplary embodiment of FIG. 7, if the threshold voltages of the first memory cell in the distributions 71 and 72 respectively belong to the voltage ranges A1 and E2, by checking the table information 91, the classification result of the first memory cell may be R5, and the first reliability information corresponding to the first memory cell may be determined as L5 (or may be obtained through a further calculation based on L5), and so on.

In an exemplary embodiment, the ECCC 508 can decode the data read from the first physical unit based on the first electrical configuration. If the data is decoded successfully, the successfully decoded data may be output (e.g., transmitted to the host system 11 of FIG. 1). If the data decoding is failed, the MMC 502 can read the data from the first physical unit based on the second electrical configuration instead. The data read based on the second electrical configuration may then be decoded by the ECCC 508 again.

In an exemplary embodiment, the first electrical configuration refers to a preset or normal electrical configuration, and the second electrical configuration refers to a special or customized electrical configuration. The preset or normal electrical configuration is, for example, an electrical configuration not specially adjusted (e.g., having a preset read current). In an exemplary embodiment, the MMC 502 can read the data from the first physical unit based on the preset or normal first electrical configuration. If the data read from the first physical unit based on the preset or normal first electrical configuration cannot be decoded successfully, the MMC 502 can read the first physical unit again based on the special or customized second electrical configuration instead. Nonetheless, in another exemplary embodiment, the first electrical configuration and the second electrical configuration may both refer to the special or customized electrical configuration, and the disclosure is not limited thereto.

In an exemplary embodiment, the ECCC 508 can decode the read data based on a hard-bit decoding mode or a soft-bit decoding mode. In the hard-bit decoding mode, the MMC 502 can first read data (e.g., hard-bits) from the first physical unit based on the first electrical configuration and the read data can then be decoded by the ECCC 508. If the decoding if failed, the MMC 502 can change to read data from the first physical unit based on the second electrical configuration instead and the ECCC 508 can then decode the read data again. If a retry read count for the first physical unit exceeds a threshold value in the hard-bit decoding mode, the ECCC 508 can leave the hard-bit decoding mode and enter the soft-bit decoding mode. In the soft-bit decoding mode, the MMC 502 can also read data (e.g., soft-bits) from the first physical unit and the ECCC 508 can then decode the data. It should be noted that, compared to the data (e.g., the hard-bits) read in the hard-bit decoding mode, the data (e.g., the soft-bits) read in the soft-bit decoding mode can provide more information that can be used to assist the decoding. Accordingly, for the data with more error bits, the decoding success rate of the soft-bit decoding mode may be higher than the decoding success rate of the hard-bit decoding mode. However, a decoding time consumed by the soft-bit decoding mode is often longer than a decoding time consumed by the hard-bit decoding mode.

In an exemplary embodiment, the MMC 502 can repeatedly read the first physical unit by using the preset electrical configuration and the read data can be decoded based on the hard-bit decoding mode by the ECCC 508. If a retry read count of the first physical unit in the hard-bit decoding mode exceeds to a threshold value, the MMC 502 can read the first physical unit based on the first electrical configuration and the second electrical configuration and then perform the operation of obtaining the first reliability information described above before the ECCC 508 enters the soft-bit decoding mode. Then, the ECCC 508 can decode the data read from the first physical unit according to the first reliability information, thereby effectively improving the decoding efficiency.

Figure 10:
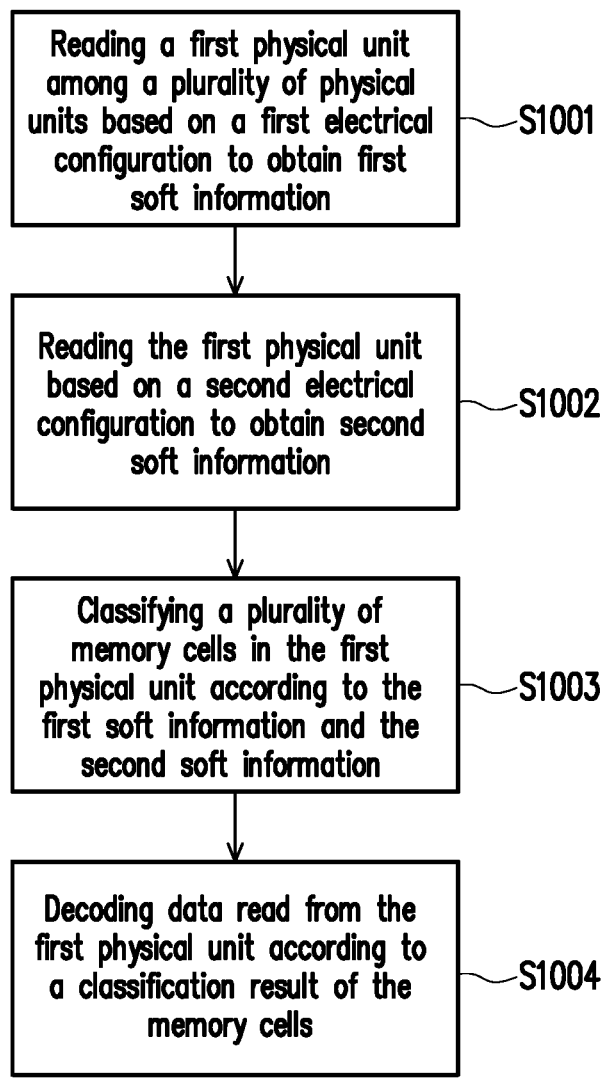
FIG. 10 is a flowchart illustrating a memory control method according to an exemplary embodiment of the disclosure.

FIG. 10 is a flowchart illustrating a memory control method according to an exemplary embodiment of the disclosure. With reference to FIG. 10, in step S1001, a first physical unit among a plurality of physical units is read based on a first electrical configuration to obtain first soft information. In step S1002, the first physical unit is read based on a second electrical configuration to obtain second soft information. Here, the first electrical configuration is different from the second electrical configuration. In step S1003, a plurality of memory cells in the first physical unit are classified according to the first soft information and the second soft information. In step S1004, data read from the first physical unit is decoded according to a classification result of the memory cells.

Nevertheless, steps depicted in FIG. 10 are described in detail as above so that related description thereof is omitted hereinafter. It should be noted that, the steps depicted in FIG. 10 may be implemented as a plurality of program codes or circuits, which are not particularly limited in the disclosure. Moreover, the method disclosed in FIG. 10 may be implemented by reference with above exemplary embodiments, or may be implemented separately, which are not particularly limited in the disclosure.

In summary, after the first soft information and the second soft information are obtained by reading the first physical unit with different electrical configurations separately, the memory cells in the first physical unit may be classified according to the first soft information and the second soft information. Then, the data read from the first physical unit may be decoded according to the classification result. In this way, even though the different memory cells may have different sensitivities to the change of the electrical parameter, the appropriate reliability information can be dynamically determined and used in the decoding operation, thereby improving the overall operational performance of the memory storage device.

The previously described exemplary embodiments of the present disclosure have the advantages aforementioned, wherein the advantages aforementioned are not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory control method for a rewritable non-volatile memory module, wherein the rewritable non-volatile memory module comprises a plurality of physical units, and the memory control method comprises:

reading a first physical unit among the physical units by using a plurality of first read voltage levels determined according to a first read current to obtain a first reading result;

grouping a threshold voltage of each memory cell in the first physical unit as belonging one voltage range among a plurality of first voltage ranges according to the first reading result;

reading the first physical unit by using a plurality of second read voltage levels determined according to a second read current to obtain a second reading result, wherein the first read current is different from the second read current;

grouping the threshold voltage of each memory cell in the first physical unit as belonging one voltage range among a plurality of second voltage ranges according to the second reading result;

classifying the each memory cell in the first physical unit according to whether a voltage change of the threshold voltage of the each memory cell in the first physical unit being greater than a threshold value or not based on the first reading result and the second reading result; and decoding data read from the first physical unit according to reliability information of the each memory cell determined based on a classification result of the each memory cell.

2. The memory control method according to claim 1, wherein a step of classifying the each memory cell in the first physical unit according to the voltage change of the threshold voltage of the each memory cell in the first physical unit being greater than the threshold value or not based on the first reading result and the second reading result comprises:

classifying a first memory cell in the first physical unit into a first-type memory cell or a second-type memory cell according to the first reading result and the second reading result, wherein a sensitivity of the first-type memory cell to a change of a read current is different from a sensitivity of the second-type memory cell to the change of the read current.

3. The memory control method according to claim 1, wherein a step of classifying the each memory cell in the first physical unit according to the voltage change of the threshold voltage of the each memory cell in the first physical unit being greater than the threshold value or not based on the first reading result and the second reading result comprises:

obtaining a relative voltage position of a first memory cell in the first physical unit in a plurality of threshold voltage distributions according to the first reading result and the second reading result; and classifying the first memory cell according to the relative voltage position of the first memory cell in the threshold voltage distributions.

4. The memory control method according to claim 1, wherein the classification result of the each memory cell at least reflects a sensitivity of the each memory cell among a plurality of memory cells in the first physical unit to a change of a read current.

5. A memory storage device, comprising:

a connection interface unit, configured to couple to a host system;

a rewritable non-volatile memory module, wherein the rewritable non-volatile memory module comprises a plurality of physical units; and a memory control circuit unit, coupled to the connection interface unit and the rewritable non-volatile memory module, wherein the memory control circuit unit is configured to:

send a first read command sequence which instructs a reading of a first physical unit among the physical units by using a plurality of first read voltage levels determined according to a first read current to obtain a first reading result;

grouping a threshold voltage of each memory cell in the first physical unit as belonging one voltage range among a plurality of first voltage ranges according to the first reading result;

send a second read command sequence which instructs a reading of the first physical unit by using a plurality of second read voltage levels determined according to a second read current to obtain a second reading result, wherein the first read current is different from the second read current;

group the threshold voltage of each memory cell in the first physical unit as belonging one voltage range among a plurality of second voltage ranges according to the second reading result;

classify the each memory cell in the first physical unit according to a voltage change of the threshold voltage of the each memory cell in the first physical unit being greater than a threshold value or not based on the first reading result and the second reading result; and decode data read from the first physical unit according to reliability information of the each memory cell determined based on a classification result of the each memory cell.

6. The memory storage device according to claim 5, wherein an operation of classifying the each memory cell in the first physical unit according to the voltage change of the threshold voltage of the each memory cell in the first physical unit being greater than the threshold value or not based on the first reading result and the second reading result by the memory control circuit unit comprises:

classifying a first memory cell in the first physical unit into a first-type memory cell or a second-type memory cell according to the first reading result and the second reading result, wherein a sensitivity of the first-type memory cell to a change of a read current is different from a sensitivity of the second-type memory cell to the change of the read current.

7. The memory storage device according to claim 5, wherein an operation of classifying the each memory cell in the first physical unit according to the voltage change of the threshold voltage of the each memory cell in the first physical unit being greater than the threshold value or not based on the first reading result and the second reading result by the memory control circuit unit comprises:

obtaining a relative voltage position of a first memory cell in the first physical unit in a plurality of threshold voltage distributions according to the first reading result and the second reading result; and classifying the first memory cell according to the relative voltage position of the first memory cell in the threshold voltage distributions.

8. The memory storage device according to claim 5, wherein the classification result of the each memory cell at least reflects a sensitivity of the each memory cell among a plurality of memory cells in the first physical unit to a change of a read current.

9. A memory control circuit unit for controlling a rewritable non-volatile memory module, wherein the rewritable non-volatile memory module comprises a plurality of physical units, and the memory control circuit unit comprises:

a host interface, configured to couple to a host system, a memory interface, configured to couple to the rewritable non-volatile memory module;

an error checking and correcting circuit; and a memory management circuit, coupled to the host interface, the memory interface and the error checking and correcting circuit, wherein the memory management circuit is configured to:

send a first read command sequence which instructs a reading of a first physical unit among the physical units by using a plurality of first read voltage levels determined according to a first read current to obtain a first reading result;

grouping a threshold voltage of each memory cell in the first physical unit as belonging one voltage range among a plurality of first voltage ranges according to the first reading result;

send a second read command sequence which instructs a reading of the first physical unit by using a plurality of second read voltage levels determined according to a second read current to obtain a second reading result, wherein the first read current is different from the second read current;

group the threshold voltage of each memory cell in the first physical unit as belonging one voltage range among a plurality of second voltage ranges according to the second reading result; and classify the each memory cell in the first physical unit according to a voltage change of the threshold voltage of the each memory cell in the first physical unit being greater than a threshold value or not based on the first reading result and the second reading result, and the error checking and correcting circuit is configured to:

decode data read from the first physical unit according to reliability information of the each memory cell determined based on a classification result of the each memory cell.

10. The memory control circuit unit according to claim 9, wherein an operation of classifying the each memory cell in the first physical unit according to the voltage change of the threshold voltage of the each memory cell in the first physical unit being greater than the threshold value or not based on the first reading result and the second reading result by the memory management circuit comprise:

classifying a first memory cell in the first physical unit into a first-type memory cell or a second-type memory cell according to the first reading result and the second reading result, wherein a sensitivity of the first-type memory cell to a change of a read current is different from a sensitivity of the second-type memory cell to the change of the read current.

11. The memory control circuit unit according to claim 9, wherein an operation of classifying the memory cell in the first physical unit according to the voltage change of the threshold voltage of the each memory cell in the first physical unit being greater than the threshold value or not based on the first reading result and the second reading result by the memory management circuit comprise:

obtaining a relative voltage position of a first memory cell in the first physical unit in a plurality of threshold voltage distributions according to the first reading result and the second reading result; and classifying the first memory cell according to the relative voltage position of the first memory cell in the threshold voltage distributions.

12. The memory control circuit unit according to claim 9, wherein the classification result of the each memory cell at least reflects a sensitivity of the each memory cell among a plurality of memory cells in the first physical unit to a change of a read current.

* * * * *